United States Patent
Turski

[11] 3,996,535
[45] Dec. 7, 1976

[54] MICROWAVE BULK ACOUSTIC DELAY DEVICE HAVING TWO TRANSDUCERS ON THE SAME SURFACE AND METHOD OF MAKING SAME

[75] Inventor: Zygmond Turski, Trevose, Pa.

[73] Assignee: RCA Corporation, New York, N.Y.

[22] Filed: July 9, 1975

[21] Appl. No.: 594,236

[52] U.S. Cl. .............. 333/30 R; 29/25.35; 310/9.5

[51] Int. Cl.² .......... H03H 9/30; H01L 41/08; H01L 41/18; H01L 41/22

[58] Field of Search .......... 333/30 R; 310/8, 8.1, 310/8.2, 9.5, 9.6; 29/25.35

[56] References Cited
UNITED STATES PATENTS

| | | | |
|---|---|---|---|
| 3,317,862 | 5/1967 | Fitch | 333/30 R |
| 3,582,834 | 6/1971 | Hanover | 333/30 R |

OTHER PUBLICATIONS

Lewis, "Improved Microwave Acoustic Delay Lines Using Magnesium Aluminate Spinel" in Journal of Science and Technology vol. 39, No. 2 1972; pp. 91–94.

*Primary Examiner*—Alfred E. Smith
*Assistant Examiner*—Marvin Nussbaum
*Attorney, Agent, or Firm*—H. Christoffersen; S. Cohen; W. Squire

[57] ABSTRACT

A wafer of lithium niobate metallized on both major surfaces is bonded to a magnesium aluminate spinel bulk acoustic delay line. The lithium niobate layer is divided into two separate electrically and mechanically isolated transducers using ion beam milling. The bulk acoustic delay line has a surface arranged to reflect a propagating acoustic wave generated by one of the divided transducers to the other of the transducers, the one transducer serving as an input and the other as an output. The acoustic delay line is suitable for broad band operation at microwave frequencies with at least 50 db isolation between the two ports.

10 Claims, 1 Drawing Figure

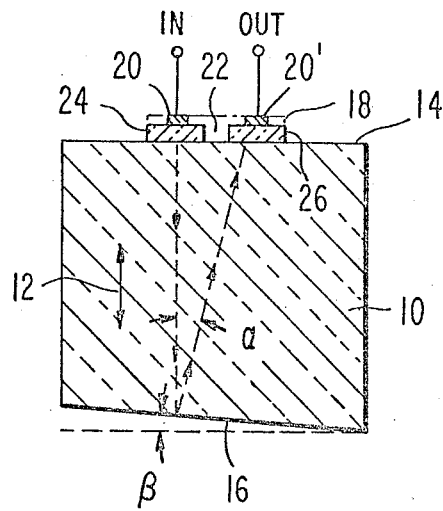

MICROWAVE BULK ACOUSTIC DELAY DEVICE HAVING TWO TRANSDUCERS ON THE SAME SURFACE AND METHOD OF MAKING SAME

The invention described herein was made in the course of or under a contract with the Department of the Navy.

FIELD OF INVENTION

This invention relates to a microwave bulk acoustic delay device.

BACKGROUND OF THE INVENTION

Microwave bulk acoustic delay devices are very costly to fabricate. These devices preferably use lithium niobate transducers made of thin wafers in submicron thicknesses metallized on opposite surfaces thereof. The lithium niobate transducer is bonded to a bulk acoustic delay medium such as magnesium aluminate ($MgOAl_2O_3$) spinel. Lithium niobate is desirable as a transducer since it has a very strong electromechanical coupling coefficient of 0.68. Lithium niobate generates an acoustic wave propagating in the shear mode along the (100) direction in the magnesium aluminate spinel. The spinel is suitable as a delay medium as it has extremely low acoustic attenuation for shear bulk acoustic waves.

However, the fabrication of such devices includes very expensive and costly techniques of bonding, lapping, polishing and ion beam milling the lithium niobate transducer to required sub-micron thicknesses. The surfaces of the lithium niobate and the spinel are polished to flatnesses of better than $1/10$ of $\lambda$ where $\lambda$ is the wavelength of sodium light. The surfaces of the various layers are parallel in seconds of arc. A detailed description of the fabrication of sub-micron lithium niobate transducers for microwave bulk acoustic delay lines is presented in several articles.

H. C. Huang, J. D. Knox, Z. Turski, R. Wargo and J. J. Hanak, "Fabrication of sub-micron, $LiNbO_3$ Transducers for Microwave Acoustic (Bulk) Delay Lines," Applied Physics Letters, Feb. 1974 Vol. 24.

H. C. Huang, J. D. Knox and Z. Turski, "Bulk Acoustic Delay Lines Utilizing Submicron Platalet $LiNbO_3$ Transducers," IEDM Technical Digest, 1973

In utilizing an anisotropic material such as spinel as the bulk delay line substrate, certain restrictions on the propagation direction are present. In one prior art configuration a single transducer serves as both the input and output ports for the device. In this configuration, an input signal is applied to the transducer and the acoustic wave launched is reflected off the oppositely disposed delay device surface to the same transducer. The separation between the input and output signals is accomplished by a microwave circulator having approximately 40 db or less isolation. There are problems present with such devices in that an input signal when applied to the single transducer may be reflected immediately producing a spurious signal feed directly to the detection circuitry. In most applications such spurious signals are undesirable.

In an alternate arrangement, the input and output transducers are disposed on respective opposite ends of the delay substrate. This arrangement is much more costly to fabricate in that two separate transducers are required.

SUMMARY OF THE INVENTION

A microwave bulk acoustic delay device comprises an acousticly anisotropic delay substrate having a unique low loss axis. First and second acoustic transducers are mounted in spaced relationship mechanically and electrically isolated from each other on one of the surfaces. Another of the surfaces is arranged to reflect an acoustic wave launched by one of the transducers directly to the other of the transducers, the transducers being arranged to respectively transmit and receive acoustic signals.

A method of making an acoustic delay device responsive to microwave signals comprises forming an acoustic delay substrate of the type having a single low loss acoustic wave propagating axis. First and second, spaced mechanically and electrically isolated acoustic wave generating transducers are formed on one of the surfaces. The transducers are arranged to transmit and receive the microwave acoustic signal. The substrate is formed so that the other surface is oriented to reflect an acoustic wave lauched by one of the transducers directly to the other of the transducers. A feature of the method is the forming of a single layer of lithium niobate on the one surface and then dividing the layer into two mechanically and electrically isolated layers.

DETAILED DESCRIPTION

In the single FIGURE of the drawing, a bulk acoustic delay device responsive to the microwave signals comprises a magnesium aluminate spinel substrate 10. The (100) axis is in the direction of arrow 12. A magnesium aluminate spinel substrate 10 is preferable in that it has very low loss in propagating an acoustic wave in the direction 12. However, this material is also characterized in that attenuation of the propagating signal increases rapidly as the direction of propagation deviates from the direction 12. Surface 14 of substrate 10 is formed to a flatness of $\lambda/10$ where $\lambda$ is the wavelength of sodium light. Oppositely disposed surface 16 is also formed flat to the same degree as surface 14 and is disposed at an angle $\beta$ of about 1.5° with the normal to the (100) axis of substrate 10. The (100) axis of substrate 10 is perpendicular to surface 14.

A single wafer of lithium niobate metallized on one major surface of the lithium niobate is bonded to surface 14 which is also metallized. Metallization of the lithium niobate preferably is achieved by a process described in co-pending application Ser. No. 573,390 filed Apr. 30, 1975 invented by Z. Turski and J. L. Vossen, Jr. and assigned to the assignee of the present invention and now U.S. Pat. No. 3,959,747. The bonding of the lithium niobate layer 18, shown dotted, is accomplished by the techniques described in the above-noted articles by H. C. Huang et al.

The lithium niobate layer is then lapped to a seven micron thickness. The lithium niobate layer is then ion beam etched to a thickness of 0.6 microns (6000 angstroms) utilizing a machine made by Thompson CFS. Conventional aluminum electrodes 20 and 20' which are preferably 5 mil diameter spots of a chromium-aluminum layer are deposited on lithium niobate layer 18.

The angle $\beta$ is formed in the substrate 10 by lapping and polishing. Using the Thompson CFS ion beam milling machine, a 5 mil wide slit 22 is formed in the lithium niobate layer 18, forming two lithium niobate transducers 24 and 26. Slit 22 is formed by applying suitable photoresist over the lithium niobate layer 18 leaving the slit area 22 exposed to the ion beam. The machine removes material at the rate of 2 microns per hour. As previously noted, the lithium layer is about 0.6 microns thick at this time and is therefore cut completely in half in less than one-half hour. The slit 22 is essential to provide good isolation between transducers 24 and 26 and to permit an insignificantly small reflection angle $\alpha$ of about 3° in the spinel material. A substantial increase in slit width results in too great an angle $\alpha$. Any substantial decrease in slit width results in poor isolation. Of course, the absolute value of the slit width is determined by the length between surfaces 14 and 16.

EXAMPLE

A single crystal $(x-cut)$ lithium niobate wafer was mechanically polished with a quarter micron diamond powder to a flatness of ($\lambda/10$) using a collimated light measuring apparatus. The scratches formed by the polishing operation were removed by a chemical polishing process using a liquid chemical abrasive material known commercially as Cyton No. HT50 made by Monsanto Corp. The wafer was diced into a plurality of rectangular wafers 120 mils on a side by 15 mils thick. This size is not critical. The magnesium aluminate spinel, $MgOAl_2O_3$ crystal has a length 250 mils along the (100) axis and a width 200 × 200 mils transverse the (100) axis. The oppositely disposed surfaces intersecting the (100) axis were aligned by a polishing process in a similar manner as the lithium niobate layer. The oppositely disposed surfaces on the spinel were formed parallel to within two seconds of arc by lapping and polishing. 100 angstroms of thickness of chromium and 2900 angstroms thickness of gold were then deposited on one polished surface of the lithium niobate and on one polished surface of the spinel. The two metallized surfaces were vacuum pressed together at room temperature. See the H. C. Huang article noted above.

The lithium niobate layer was then lapped to 7 micron thickness flat and parallel to within two seconds of arc to the parallel surfaces of the spinel substrate. The thickness of the lithium niobate is related to the frequency of the signal to be processed thereby. The lithium niobate was ion beam etched to 0.6 microns corresponding to a center frequency of 3 GHz. The chromium aluminum electrodes were then evaporated on the exposed outer surface of the lithium niobate, 2000 angstroms thick, the chromium being 100 angstroms and the aluminum 1900 angstroms. The aluminum electrodes are 13.1 mils center to center distance and 5 mils in diameter. The electrodes were formed in two columnar arrays with a plurality of electrodes in each array. The oppositely disposed end of the spinel substrate was lapped and polished to an angle $\beta$ of 1.5°. It is to be noted that the electrodes 20 and 20' in the drawing are spaced so that the propagating wave is reflected off the surface 16 at an angle $\alpha$ of about 3°. A suitable photoresist was deposited on the lithium niobate with an exposed area of about 5 mils corresponding to slot 22. The lithium niobate was then disposed in an ion beam milling machine and divided by a 5 mil wide gap 22 at the exposed area to form the two transducers 24 and 26. The lithium layer was cut completely through to form two completely isolated and separate transducers. The photoresist on the surfaces of the lithium niobate layer was then removed.

The delay line was then assembled to a microwave test (jig). An RF signal in the frequency range of 2 to 4 GHz was applied to electrode 20. The isolation, i.e. mechnical and electrical, between the two transducers 24 and 26 measured to be better than 50 db. See Table I. By mechanical isolation is meant direct vibrational interaction between the two transducers 24 and 26. This mechanical isolation is essential to the present invention.

TABLE I

| Gigahertz | Feedthrough |
|---|---|
| 2.0 | 50 db |
| 2.5 | 60 db |
| 3.0 | 52 db |
| 3.5 | 50 db |
| 4.0 | 50 db |

The test signal was a 1 milliwatt RF pulse having a pulse width of 0.5 microseconds. The test jig comprised a microstrip device having two conventional coaxial connectors electrically coupled to the electrodes 20 and 20' by spring fingers each finger being connected to a microstrip at one end and spring loaded to the electrodes 20 and 20' as the case may be at the other end.

It will be appreciated that the ion beam milling of the lithium niobate layer 18 and the two transducers 24 and 26 provides for a superior arrangement in that the surfaces of the lithium niobate layer adjacent to the ion beam cut remain flat and parallel at the cut area. As shown above by the test results, the deviation of a few degrees of the propagation of the acoustic wave from the (100) axis does not substantially affect the loss in the substrate. However, increasing the spacing between the electrodes to the point where the angle $\alpha$ is increased substantially beyond 3° results in a compromise in the efficiency of the device.

What is claimed is:
1. A microwave bulk acoustic delay device comprising:
    an acoustic delay cubic crystalline substrate of the type having a low loss acoustic wave propagating axis, said substrate having first and second oppositely disposed planar surfaces, and
    first and second acoustic wave transducers mounted in spaced relationship mechanically and electrically isolated from each other on one of said surfaces, the other of said surfaces being arranged to reflect an acoustic wave generated by one of said transducers directly to the other of said transducers, said transducers being respectively arranged to transmit and receive an electrical periodic signal having a repetition rate at microwave frequencies.
2. The device of claim 1 wherein said substrate is magnesium aluminate spinel, $MgOAl_2O_3$.
3. The device of claim 1 wherein said transducers are each made of lithium niobate $LiNbO_3$ bonded to said substrate.
4. The device of claim 3 wherein said lithium niobate has a submicron thickness.
5. The device of claim 1 wherein said transducers are spaced from each other a distance corresponding to an angle of about 3° between said generated and reflected acoustic waves.
6. A method of making an acoustic delay device responsive to the microwave signals comprising:
    forming an acoustic delay cubic crystalline substrate of the type having low loss acoustic wave propagating axis, said substrate having first and second oppositely disposed planar surfaces, and
    forming first and second spaced mechanically and electrically isolated acoustic wave generating transducers on one of said surfaces, said transduc- ers being arranged to respectively transmit and receive an electrical periodic signal having a minimum repetition rate of at least one gigahertz, said substrate forming steps including forming the other or said surfaces on an orientation arranged to reflect an acoustic wave generated by one of said transducers directly to the other of said transducers.

7. The method of claim 6 wherein said first and second transducer forming steps include the steps of forming a single layer of transducer material on said one surface and dividig said layer into two mechanically and electrically isolated layers.

8. The method of claim 6 wherein said transducer forming step includes depositing a layer of transducer material on said substrate and ion milling said layer into two separate transducers.

9. The method of claim 6 wherein said transducers forming step includes forming a single planar layer of lithium niobate,
bonding the layer of lithium niobate to the substrate ion beam etching the lithium niobate to a submicron thickness, and forming the single layer into two spaced layers separated by an air gap.

10. The method of claim 9 wherein said two layer forming step includes ion beam milling to form said air gap.

* * * * *